United States Patent
Pinarello et al.

(10) Patent No.: US 8,482,348 B2
(45) Date of Patent: Jul. 9, 2013

(54) CLASS OF POWER AMPLIFIERS FOR IMPROVED BACK OFF OPERATION

(75) Inventors: Sandro Pinarello, Munich (DE); Jan-Erik Mueller, Ottobrunn (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/221,118

(22) Filed: Aug. 30, 2011

(65) Prior Publication Data

US 2013/0049867 A1 Feb. 28, 2013

(51) Int. Cl.
H03F 1/14 (2006.01)
H03F 3/68 (2006.01)
H03F 1/22 (2006.01)

(52) U.S. Cl.
USPC .............................. 330/51; 330/295; 330/311

(58) Field of Classification Search
USPC .................................... 330/51, 295, 310, 311
See application file for complete search history.

(56) References Cited

U.S. PATENT DOCUMENTS

| | | | |
|---|---|---|---|
| 6,137,367 A | 10/2000 | Ezzedine et al. | |
| 8,022,772 B2 * | 9/2011 | Cassia et al. | 330/311 |
| 8,120,428 B2 * | 2/2012 | Montalvo et al. | 330/311 |
| 8,189,713 B2 * | 5/2012 | Shinsuke et al. | 375/297 |

OTHER PUBLICATIONS

Alireza Shirvani, et al., "A CMOS RF Power Amplifier With Parallel Amplification for Efficient Power Control", IEEE Journal of Solid-State Circuits, vol. 37, No. 6, Jun. 2002, p. 684-693.
Kumar Narendra, et al., "Impedance Adjustment for Constant Efficiency Power Amplifier Applying Stage Bypass Method", IEEE Xplore, 2007, p. 266-269.
P. Reynaert, et al., "Power Combining Techniques for RF and mm-wave CMOS Power Amplifiers", IEEE, 2007, p. 272-275.
Peter Heidi, et al., "A 5.8 GHz Linear Power Amplifier in a Standard 90nm CMOS Process Using a 1V Power Supply", IEEE Radio Frequency Integrated Circuits Symposium, 2007, p. 431-434.
Francesco Carrara, et al., "A 2.4 Ghz 24-dBm SOI CMOS Power Amplifier with Fully Integrated Reconfigurable Output Matching Network", IEEE Transactions on Microwave Theory and Techniques, vol. 57, No. 9, Sep. 2009, p. 2122-2130.
Viral K. Parikh, et al., "A Fully Digital Architecture for Wideband Wireless Transmitters", IEEE 2008, p. 147-150.
Xin He, et al., "A 1.2V, 17dBm Digital Polar CMOS PA with Transformer-based Power Interpolating", IEEE, 2008, p. 486-489.
Calogero D. Presti, et al., "A High-Resolution 24-dBm Digitally-Controlled CMOS PA for Multi-Standard RF Polar Transmitters", IEEE, 2008, p. 482-485.
Gang Liu, et al., "A 1.2V, 2.4GHz Fully Integrated Linear CMOS Power Amplifier with Efficiency Enhancement", IEEE 2006 Custom Integrated Circuits Conference (CICC), p. 141-144.

* cited by examiner

*Primary Examiner* — Steven J Mottola
(74) *Attorney, Agent, or Firm* — Eschweiler & Associates, LLC (57) ABSTRACT

One embodiment of the present invention relates to a power amplifier comprising a plurality of amplifying elements connected in a serial-parallel matrix configuration, containing parallel columns having amplifying elements connected in series. The parallel columns are connected to a common output path coupled to a supply voltage source configured to provide an equal supply voltage to each of the columns. One or more input signals (e.g., RF input signals) are connected to the power amplifier by way of input terminals on a first row of amplifying elements. The remaining amplifying elements have control terminals that are connected to independent control signals, which allow each amplifying element to be operated independent of the other amplifying elements in the matrix. This selective operation of amplifying elements allows for improved efficiency over a wide range of power amplifier output powers.

19 Claims, 10 Drawing Sheets

CLASS OF POWER AMPLIFIERS FOR IMPROVED BACK OFF OPERATION

BACKGROUND OF THE INVENTION

Power amplifiers are electronic devices that increase (i.e., amplify) the power of an electric signal. Power amplifiers are widely used in low-power communication systems. Typically, a power amplifier is located in the output stage of a transmission chain and is configured to increase the power of a radio frequency (RF) signal before it is transmitted from an antenna.

Communication systems employing power amplifiers may send signals according to certain communication standards (e.g., EDGE, WCMDA, LTE, etc.). Many such communication standards allow for different levels of output-power with different statistics of emission. Therefore, power amplifiers are often operated to generate output signals spanning a wide output power range (e.g., from a low output power to a maximum output power). However, when a power amplifier is operated to output a signal having less than the maximum output power for which the amplifier is designed, the efficiency of the power amplifier decreases.

The decrease in efficiency of a power amplifier may be mitigated by lowering the DC supply voltage at the output of the power amplifier in order to lower the overall power consumption of the power amplifier. The effectiveness of such a solution depends upon an optimum load matching between the power amplifier load and an output impedance, which is controlled by an output matching network located at the output of the power amplifier. To retain a high efficiency, the output matching network changes the output impedance when the supply voltage changes. Changing the DC supply voltage without a corresponding change in the output impedance, causes an impedance mismatch that reduces efficiency of the power amplifier.

BRIEF DESCRIPTION OF THE DRAWINGS

FIG. 6 illustrates a block diagram showing parasitic elements of the power amplifier circuit of FIG. 5a.

DETAILED DESCRIPTION OF THE INVENTION

The present invention will now be described with reference to the attached drawing figures, wherein like reference numerals are used to refer to like elements throughout, and wherein the illustrated structures and devices are not necessarily drawn to scale.

Some aspects of the present disclosure provide for a power amplifier that maintains a high efficiency over a broad range of output powers. In one embodiment, the power amplifier comprises a plurality of amplifying elements connected in a serial-parallel matrix configuration, containing parallel columns of amplifying elements connected in a series connection. The parallel columns are connected to a common output path coupled to a supply voltage source configured to provide an equal supply voltage to each of the columns. The plurality of amplifying elements have control terminals connected to independent control signals, which allow each amplifying element to be operated independent of the other amplifying elements in the matrix. Amplifying elements a first row have control terminals further connected to one or more input signals (e.g., RF input signals). When operating at maximum output power, all amplifying elements operate to amplify the input signal(s). When operating in a reduced power, back-off operating mode, the independent control signals allow for a subset of the amplifying elements to operate as amplifiers while the remainder of amplifying elements operate as switches that consume substantially no power. This selective operation of amplifying elements allows for improved efficiency over a wide range of power amplifier output powers.

Figure 1:
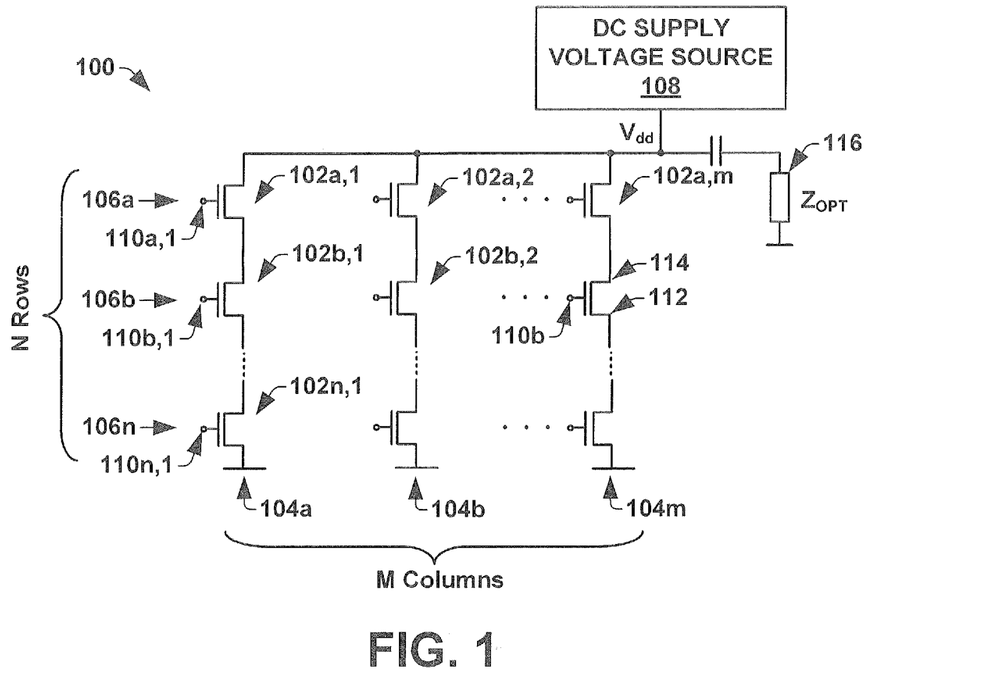
FIG. 1 illustrates a schematic diagram of a first embodiment of a power amplifier circuit as provided herein.

FIG. 1 illustrates a schematic diagram of a first embodiment of a power amplifier circuit 100 as provided herein.

The power amplifier circuit 100 comprises a plurality of amplifying elements 102 in a serial-parallel matrix configuration. The serial-parallel matrix configuration contains M columns 104a-104m and N rows 106a-106n. Respective columns have N amplifying elements 102a,x-102n,x connected in a series connection. The columns 104 are connected in parallel to a common output path coupled to a DC supply voltage source 108, configured to output a variable supply voltage $V_{dd}$. The variable supply voltage $V_{dd}$ is applied equally to output terminals of the last amplifying element 102a,1-102a,m in each column.

Each amplifying element 102 has a control terminal 110 configured to receive an independent control signal. The independent control signals enable each amplifying element to be operated independent of the other amplifying elements in the matrix. Therefore, the active area (e.g., the number of amplifying element acting as amplifiers in a power amplifier architecture) of the power amplifier can be selectively adjusted in conjunction with an adjustment to the supply voltage $V_{dd}$, thereby enabling matching between the matrix impedance and the output load impedance over a broad range of output powers.

More particularly, during operation, changes to the power amplifier's active area and supply voltage allow the power amplifier circuit 100 to be efficiently operated at a maximum power output (i.e., to generate a maximum output power) or in one or more back-off operating modes (e.g., to generate reduced output powers).

For example, when operating at a maximum output power the plurality of amplifying elements 102 in the power amplifier matrix are operated as amplifiers. In particular, all of the amplifying elements 102 amplify an input signal(s) (e.g., an RF input signal) received at control terminals 110n. For example, amplifying elements 102a,1-102n,1 amplify an RF input signal received at control terminals 110n, 1, amplifying elements 102a,2-102n,2 amplify an RF input signal received at control terminals 110n, 2, etc.

When operating in a back-off operating mode, to maintain a same efficiency as at maximum output power the DC supply voltage $V_{dd}$ is reduced and the active area of the power amplifier is reduced by selectively operating a subset of the plurality of amplifying elements as amplifiers while the remainder of amplifying elements operate as non-amplifiers (e.g., as on or off switches).

In one embodiment, the amplifying elements 102 may comprise semiconductor devices (i.e., transistors). For example, the amplifying elements may comprise Gallium Arsenide (GaAs) semiconductor devices. In such an embodiment, the control terminal 110 of each transistor comprises a gate terminal configured to receive a gate bias voltage for controlling the flow of current between a source terminal 112 and a drain terminal 114 of the transistor. A column of stacked transistor devices are connected in a series connection, such that the drain 114n of a first transistor is connected to the source 112 of the next transistor, and the drain of the last transistor is configured to receive a drain voltage $V_{dd}$ from DC supply voltage source 108. The drain of the last transistor is also connected by way of an optimized output load 116 to the output terminal of the power amplifier.

One of ordinary skill in the art will appreciate that such a semiconductor transistor device may be switched between operating as an amplifier, an open switch (i.e., an open), and a closed switch (e.g., a short), by varying the gate bias voltage and/or the drain voltage applied to the transistor.

For example, a transistor may be operated as an amplifier by applying a particular gate bias voltage that drives the transistor into an active region (saturation region) of operation. When operating as an amplifier, the transistor is configured to amplify a current applied to the gate terminal or the source terminal. Thus, at maximum output power (i.e., all transistors operating as amplifiers) an RF input signal applied at input terminal 110n,1 is amplified by transistors 102n,1 . . . 102b,1 and 102a,1. If the gate bias voltage is sufficiently reduced (e.g., $V_{GS}<V_{TH}$), the transistor operates as a turned off switch (i.e., an open with no conduction between drain and source). If the gate bias voltage is sufficiently increased (e.g., to a value driving the transistor to an ohmic region) and/or if the supply voltage is sufficiently decreased (e.g., to a value so that $V_{GS}$-$V_{TH}$ is higher than $V_{dd}$), the transistor operates as a turned on switch (i.e., a short).

Figure 2:
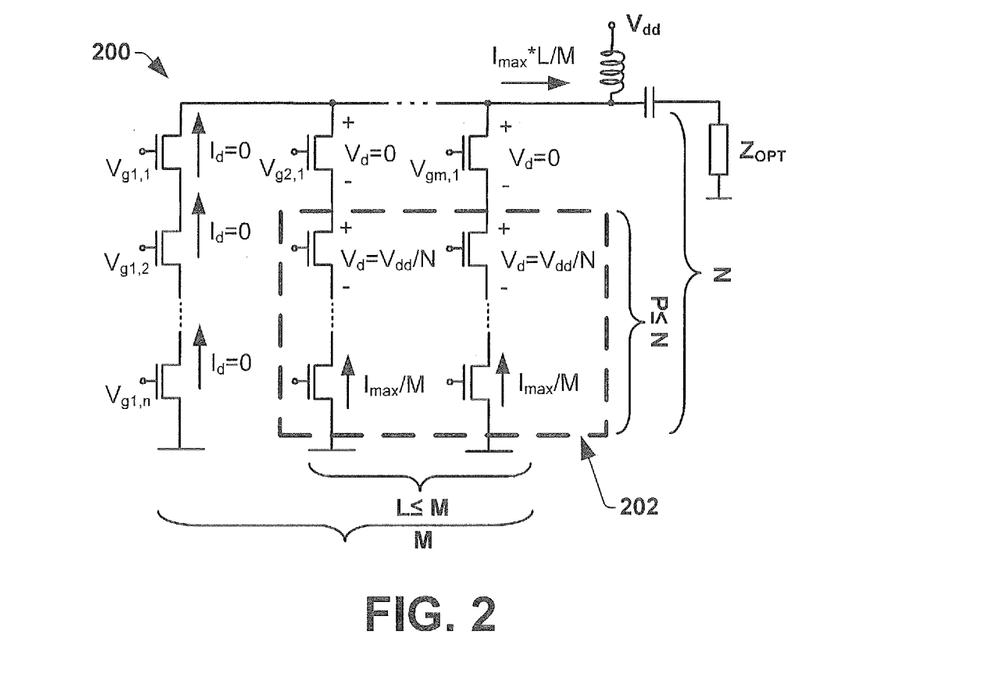
FIG. 2 illustrates a schematic diagram of a power amplifier circuit, comprising a plurality of transistors in a serial-parallel matrix configuration, operating at a maximum output power and in a back-off operating mode.

FIG. 2 illustrates a schematic diagram of a power amplifier circuit 200, comprising a plurality of transistors in a serial-parallel matrix configuration, operating at a maximum output power and in a back-off operating mode. One or ordinary skill in the art will appreciate that although FIG. 2 is described below for a matrix of transistors having an equal width and/or type, that this is one non-limiting example provided to better explain the concepts disclosed herein.

Referring to FIG. 2, the current through each of the serially coupled transistors in a column is the same, and the voltage drop across a column is equal to sum of the voltage drops across each of the serially coupled transistors in the column. Therefore, at maximum output power (with M×N transistors operating as amplifiers) a current of $I_{TS}=I_{max}/M$ is delivered by each transistor and a voltage drop of $V_{TS}=V_{dd,max}/N$ is distributed across each transistor (since the drain voltage $V_{dd}$ is applied equally to each of the parallel columns). Accordingly, the impedance seen by each of the transistors is $Z_{TS}=V_{TS}/I_{TS}=Z_{load}\cdot M/N=Z_{opt}$ and the drain efficiency ($\eta$) of each transistor is equal to: $\eta=P_{out}/P_{dc}=P_{out}/(V_{dc}\cdot I_{dc})=P_{out}/(V_{dd,max}\cdot I_{max}/(N\cdot M))$.

In a back-off operating mode, the active area of the power amplifier circuit is reduced so that a subset 202 of L×P transistors are configured to operate as amplifiers, while the remaining transistors operate non-amplifiers using almost no DC power (e.g., having no current or voltage). As illustrated in FIG. 2, the subset 202 comprises a fraction of the amplifying elements in a column of the serial-parallel matrix (e.g., P amplifying elements out of a column of N amplifying elements) and a fraction of amplifying elements in a row of the serial-parallel matrix configuration matrix (e.g., L amplifying elements out of a row of M amplifying elements).

Therefore, in a back-off operating mode, a current of $I_{TS}=I_{max}/M$ is delivered by each active transistor is so that the total current delivered by the power amplifier is $I_{TS}=I_{max}\cdot(L/M)$. The drain voltage is reduced to $V_{dd}\cdot P/N$ so that a voltage drop of $V_{TS}=V_{dd,max}\cdot(P/N)/P=V_{dd,max}/N$ is distributed across each transistor. Accordingly, the impedance seen by each transistor that is equal to $V_{TS}/I_{TS}=Z_{load}\cdot M/N$ and the drain efficiency ($\eta$) is equal to: $\eta=P_{out}/P_{dc}=P_{out}/(V_{dc}\cdot I_{dc})=P_{out}/(V_{dd,max}\cdot I_{max}/(N\cdot M))$.

Accordingly, by adjusting the active area of the power amplifier circuit (i.e., by selectively changing the number of transistors operating as amplifiers within the power amplifier matrix) in proportion to the change in supply voltage $V_{dd}$ the efficiency of the power amplifier remains unchanged in light of changes to the supply voltage $V_{dd}$. In other words, the efficiency of the power amplifier is maintained in the back-off operating mode since the ratio between output power $P_{out}$ and DC current reduces with a direct proportionality to the DC supply voltage ratio. This allows for the overall efficiency of the power amplifier to remain constant over a wide range of output powers.

Figure 3A:
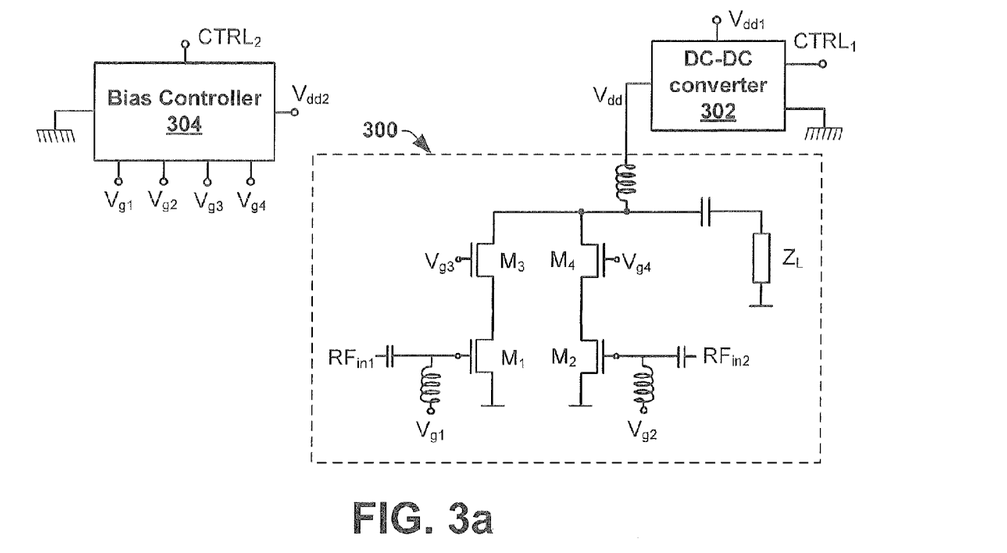
FIG. 3a illustrates a schematic diagram of an exemplary power amplifier comprising a 2×2 transistor matrix.
Figure 3B:
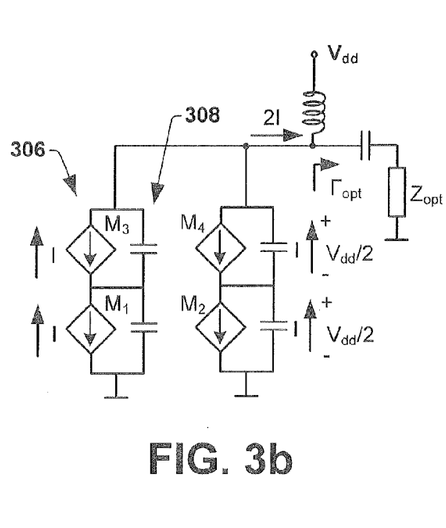
FIGS. 3b and 3c show block diagrams of the transistors in the power amplifier of FIG. 3a illustrated as a current source, an open switch, or a short.
Figure 3C:
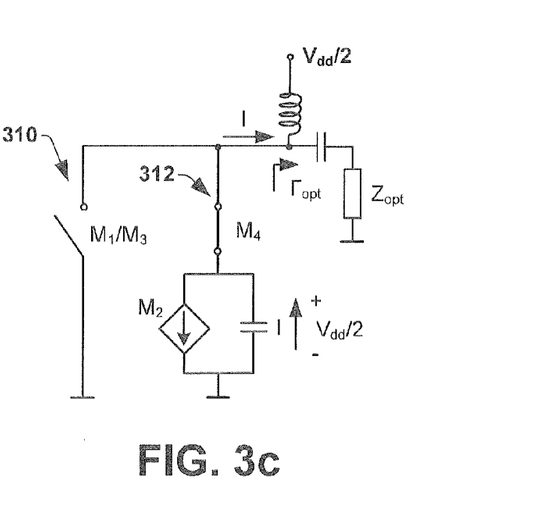

FIGS. 3a-3c illustrate a particular example of an exemplary power amplifier as provided herein. FIG. 3a illustrates a schematic diagram of the power amplifier. FIGS. 3b and 3c show block diagrams of the transistors in the power amplifier, for different output powers, illustrated as a current source 306 (when operating in an amplifier mode), an open switch/open 310 (when operating in an off switch mode), or a closed switch/short 312 (when operating in an on switch mode), with parasitic capacitances 308 (e.g., gate-source capacitances) shown in parallel to the current source 306.

It will be appreciated that the exemplary power amplifiers provided herein are simplified examples that are illustrated to better explain the inventive concepts disclosed herein. Accordingly, one of ordinary skill in the art will appreciate that the illustrated power amplifiers may be comprised within a larger power amplifier matrix or that the illustrated transistors may correspond to one or more actual transistors (e.g., stacked transistors, cascoded transistors, etc.). For example, transistors $M_1$ in FIG. 3a may correspond to a plurality of actual transistors (e.g., two or more serial/parallel coupled transistors), cumulatively having properties represented by transistor $M_1$.

Figure 13:
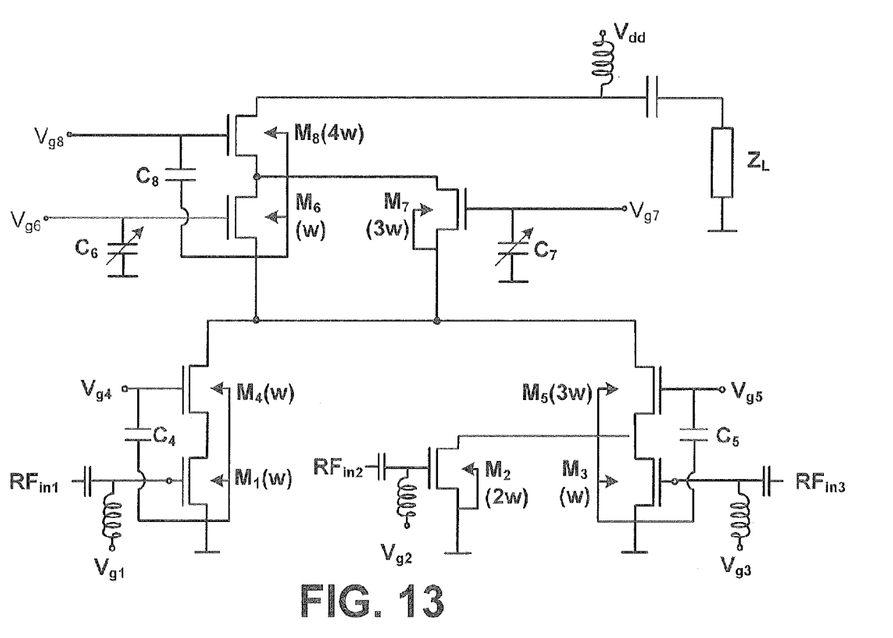
FIG. 13 illustrates an alternative embodiment of an exemplary power amplifier comprising cascoded transistors.

Referring to FIG. 3a, the power amplifier 300 comprises a 2×2 matrix of transistors $M_1$-$M_4$ in a serial-parallel configuration. In the embodiment shown, each of the transistors $M_1$-$M_4$ has a substantially equal gate width and is of a same type (e.g., p-type, n-type). In alternative embodiments, the transistors may have varying gate widths (e.g., as shown in FIG. 13) and/or be of varying types.

Separate input signals, $RF_{in1}$ and $RF_{in2}$, are connected to the power amplifier 300 at the DC-decoupled gate terminals of transistors $M_1$ and $M_2$. The separate RF input signals are amplified according to different amplification paths, thereby allowing the matrix to be operated to efficiently generate a wide range of output powers. For example, the input signal $RF_{in1}$ is successively amplified (i.e., summing the power outputs) by a column of the matrix containing amplifying transistors $M_1$ and $M_3$ and input signal $RF_{in2}$ is successively amplified by a column of the matrix containing amplifying transistors $M_2$ and $M_4$.

A DC-DC converter 302 is coupled to a common output path having an optimum output load $Z_{opt}$. The DC-DC converter 302 is configured to provide an equal supply voltage $V_{dd}$ to the drains of transistors $M_3$ and $M_4$.

A bias controller 304 is configured to generate a plurality of independent gate bias voltages $V_{g1}$-$V_{g4}$, which are applied to the gate terminals of transistors $M_1$-$M_4$ as indicated in the figure (e.g., $V_{g1}$ is applied to the gate of transistor $M_1$, $V_{g2}$ is applied to the gate of transistor $M_2$, etc.). Applying independent gate bias voltages $V_{g1}$-$V_{g4}$ to separate transistor gates allows separate transistors to individually operate as an amplifier, an open switch/open, or a closed switch/short.

As illustrated in FIG. 3b, at maximum output power transistors $M_1$-$M_4$ are operated as amplifiers (e.g., $M_1$ and $M_3$ amplify $RF_{in1}$ and $M_2$ and $M_4$ amplify $RF_{in2}$). In particular, the drain of transistors $M_3$ and $M_4$ are biased at a nominal supply voltage of $V_{dd}$. The gate bias voltages applied to transistors $M_1$ and $M_2$ have an equal value (e.g., $V_{g1}$=$V_{g2}$), which is chosen in accordance with a desired class of operation of the power amplifier. The gate bias voltages applied to transistors $M_3$ and $M_4$ also have an equal value (e.g., $V_{g3}$=$V_{g4}$), which is chosen such that the voltage swing at the common output path is equally divided between the columns of the matrix.

Such bias conditions cause transistors $M_1$ and $M_3$ to generate a current of I and transistors $M_2$ and $M_4$ have a current of I, for an overall output current of 2I. Furthermore, a voltage drop of $V_{dd}/2$ is experienced by each of row of the matrix (e.g., transistors $M_1$ and $M_2$ each experience a voltage drop of $V_{dd}/2$ and transistors $M_3$ and $M_4$ each experience a voltage drop of $V_{dd}/2$), for an overall voltage drop of $V_{dd}$. These bias conditions result in a total output power of $P_{max}$, which is optimized for a constant output load $Z_{opt}$ (reached at an optimum reflection coefficient $\Gamma_{opt}$).

As illustrated in FIG. 3c, in a back-off operating mode the drain of transistors $M_3$ and $M_4$ are biased at a reduced supply voltage of $V_{dd}/2$. The gate bias voltage $V_{g2}$ remains the same as at maximum output power (e.g., FIG. 3b) so that transistor $M_2$ continues to operate as an amplifier. The gate bias voltage $V_{g4}$ is raised to a voltage value that causes transistor $M_4$ to operate as a closed switch (i.e., a short). The gate bias voltages $V_{g1}$ and/or $V_{g3}$ are lowered to a voltage value that causes transistors $M_1$ and $M_3$ operate as open switches.

Such bias conditions cause transistor $M_2$ and $M_4$ to have a current of I and transistors $M_1$ and $M_3$ to have a current of 0, for an overall output current of I. Furthermore, a voltage drop of $V_{dd}/2$ is experienced by transistor $M_2$ and a voltage drop of 0 is experienced by transistor $M_4$, for an overall voltage drop of $V_{dd}/2$. These bias conditions result in a total output power that is $1/4^{th}$ of the maximum output power (i.e., $P_{max}/4$). However, the efficiency of the overall power amplifier circuit (i.e., the efficiency of the active area of the power amplifier) remains the same and the transistors remain optimized with the constant load impedance $Z_{opt}$ (to reach the output power at the optimum reflection coefficient $\Gamma_{opt}$).

Figure 4A:
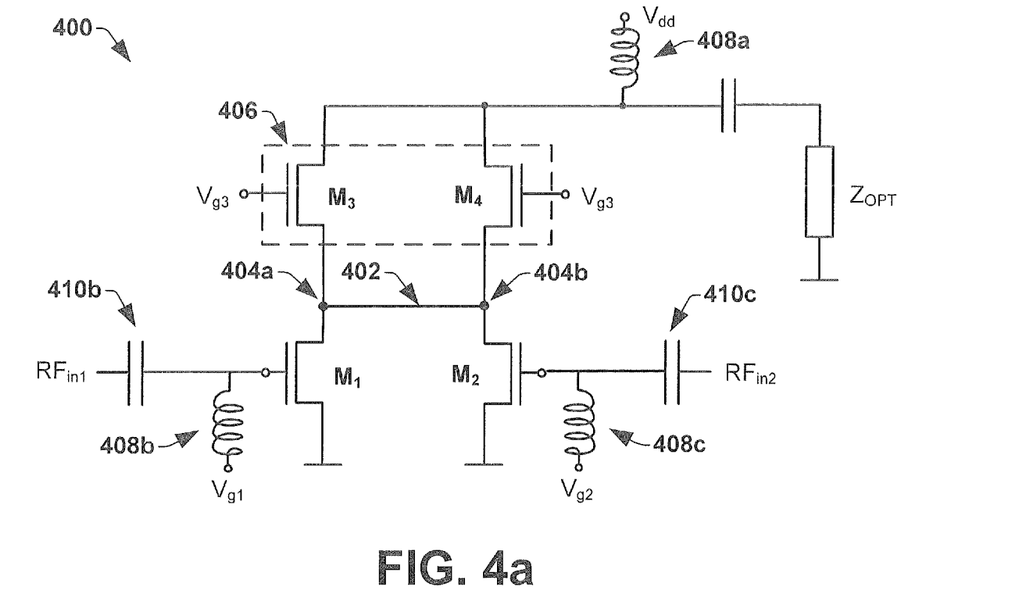
FIGS. 4a-4b illustrate a schematic diagram of an alternative embodiment of a power amplifier circuit comprising an electrical connection between nodes located on adjacent columns of serially connected transistors.
Figure 4B:
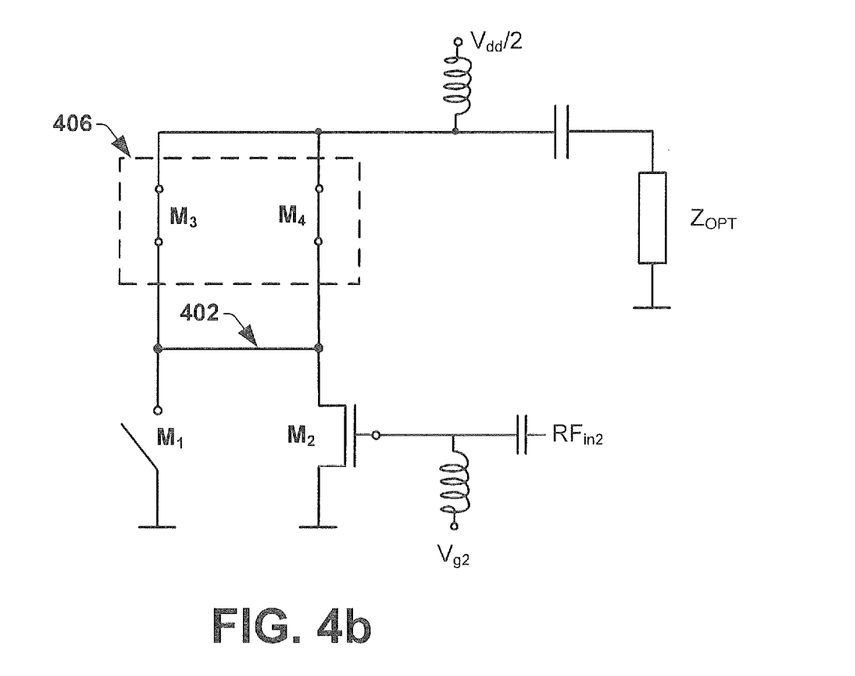

FIGS. 4a-4b illustrate a schematic diagram of an alternative embodiment of an exemplary power amplifier circuit 400. The power amplifier circuit 400 comprises an electrical connection 402 between nodes, 404a and 404b, located on adjacent columns of serially connected (i.e., stacked) transistors. The electrical connection 402 causes transistors $M_3$ and $M_4$ to be connected in a parallel connection.

At maximum output power, transistors $M_3$ and $M_4$ are both biased at a gate voltage equal to $V_{g3}$, which is chosen to have a value that divides the output voltage across the two columns of transistors. The use of a same gate bias voltage causes transistors $M_3$ and $M_4$ to operate as a single transistor in block 406. Transistors $M_1$ and $M_2$ may be biased at gate voltages having an equal value (e.g., $V_{g1}$=$V_{g2}$), which is chosen in accordance with a desired class of operation of the power amplifier.

In a back-off operating mode, as illustrated in FIG. 4b, the bias-voltage of the uppermost drain can be lowered to $V_{dd}/2$ and the gate bias voltages $V_{g3}$ supplied to transistors $M_3$ and $M_4$ can be raised to drive the transistors in block 406 to operate as an on switch (i.e., a short). The parallel connection of transistors $M_3$ and $M_4$, reduces losses in the power amplifier circuit 400.

Referring again to FIG. 4a, the supply voltage $V_{dd}$ and some gate bias voltages $V_{gx}$ are connected to the power amplifier through chokes 408. The chokes 408 allow low-frequency (e.g., DC) signals to pass, but block high-frequency (e.g., RF) signals. For example, a choke 408a, located between the drain of transistors $M_3$ and $M_4$ and the supply voltage source $V_{dd}$, allows the DC supply voltage $V_{dd}$ to flow freely while blocking the flow of the amplified RF signal.

The RF inputs, $RF_{in1}$ and $RF_{in2}$, are connected to the power amplifier through capacitors 410. The capacitors 410 allow high frequency RF signals to pass, but block low frequency (e.g., DC) signals. For example, a capacitor 410a, located between the RF input $RF_{in}$ and the gate of transistor $M_1$, allows the RF input signal to flow freely while blocking the flow of the DC gate voltage $V_{g1}$.

Figure 5A:
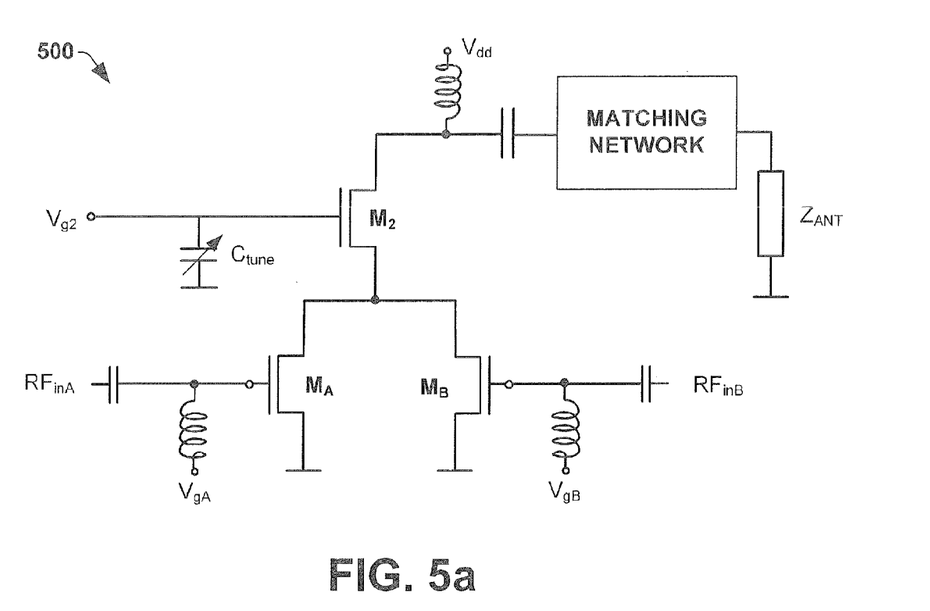
FIG. 5a illustrates a schematic diagram of an alternative embodiment of a power amplifier circuit as provided herein.
Figure 5B:
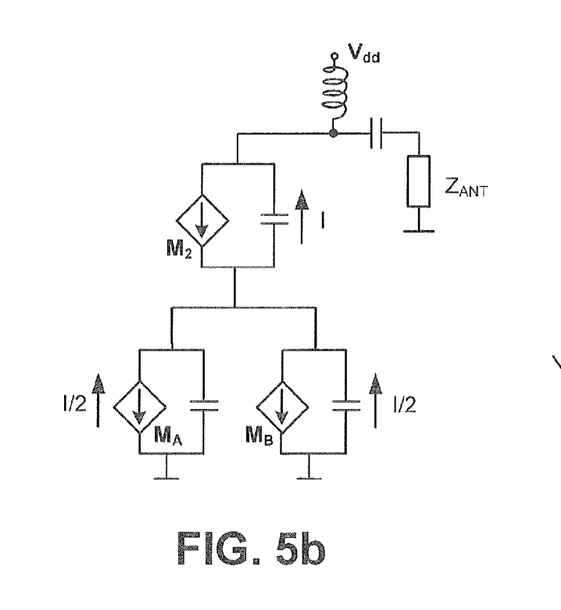
FIGS. 5b and 5c show block diagrams of the transistors in the power amplifier of FIG. 5a illustrated as a current source, an open switch, or a short, for different output powers.
Figure 5C:
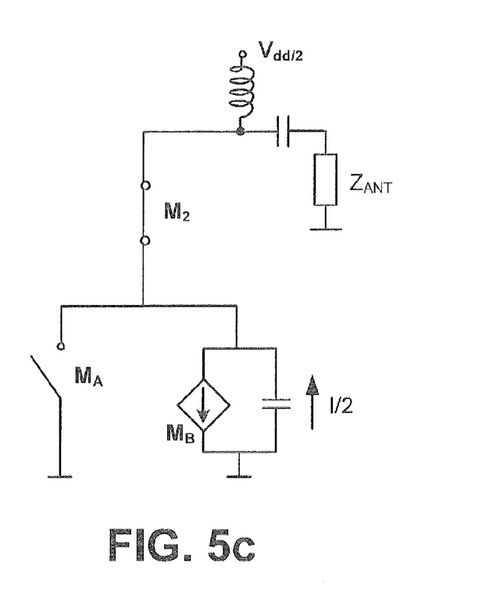

FIGS. 5a-5c illustrate an alternative embodiment of an exemplary power amplifier as provided herein. FIG. 5a illustrates a schematic diagram of the power amplifier circuit 500. FIGS. 5b and 5c show block diagrams of the transistors in FIG. 5a illustrated as a current source, an open switch/open, or a closed switch/short.

Referring to FIG. 5a, a single transistor $M_2$ has a drain coupled to the supply voltage source $V_{dd}$ and a source that is connected to parallel transistors $M_A$ and $M_B$. Transistors $M_A$ and $M_B$ each have a separate RF input, $RF_{inA}$ and $RF_{inB}$ respectively. In one embodiment, described below, transistor $M_2$ may have a gate width that is twice the gate width of the parallel transistors $M_A$ and $M_B$, so that the density of current across transistor $M_2$ is the same as the density of current across transistors $M_A$ and $M_B$.

A variable tuning capacitor $C_{tune}$ is connected to the gate of the transistor $M_2$. The tuning capacitor $C_{tune}$ regulates the coupling of the RF signal with the supply voltage $V_{dd}$ so that the supply voltage is equally distributed across the rows of the matrix (e.g., the row containing $M_2$ and the row containing $M_A$ and $M_B$). In one embodiment, the tuning capacitor $C_{tune}$ may comprise a varactor. In an alterative embodiment, the tuning capacitor $C_{tune}$ may comprise a reconfigurable bank of standard capacitors available in the technology chosen to fabricate the power amplifier circuit.

FIG. 5b illustrates the power amplifier circuit 500 operating at maximum output power. As illustrated in FIG. 5b, when operating at maximum power the supply voltage is set to $V_{dd}$ and transistors $M_A$, $M_B$, and $M_2$ are operated as amplifiers. Transistors $M_A$ and $M_B$ are each configured to have a current of I/2 and transistor $M_2$ is configured to have a current of I, such that the overall output current is I.

FIG. 5c illustrates a power amplifier circuit 500 operating in a 6 dB back-off operating mode. As illustrated in FIG. 5c, when operating at a back-off operating mode the supply voltage is reduced to $V_{dd}/2$, gate bias voltage $V_{g2}$ is adjusted to short transistor $M_2$, and gate bias voltage $V_{gA}$ is adjusted to turn off transistor $M_A$. The resulting overall output current is I/2, one-half of current at maximum power. Furthermore, transistor $M_B$, operating with the same efficiency, outputs a power that is ¼th that of the maximum output power.

Figure 6:
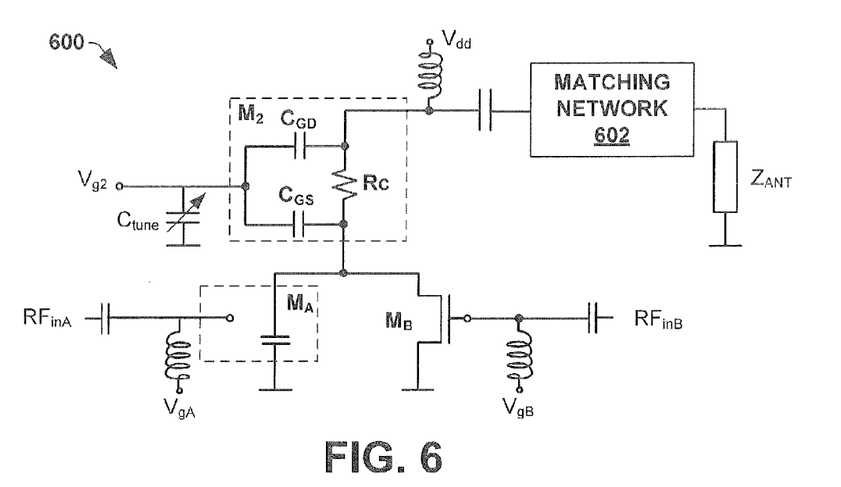

FIG. 6 illustrates block diagram 600 showing parasitic elements of the power amplifier circuit of FIG. 5a in a back-off operating mode. As shown in FIG. 6, a tunable capacitor $C_{tune}$ may be connected as a shunt capacitor on the RF signal path at the gate of $M_2$. At maximum output power, capacitor $C_{tune}$ may be tuned to regulate the coupling of the RF signal with the gate bias voltage $V_{g2}$ at the gate of transistor $M_2$, so that the supply voltage is equally distributed across the rows of the matrix.

In a back-off operating mode, transistor $M_2$ is operated as a short (e.g., a switch in an on state) having a resistance Rc and transistor $M_A$ operated as an open (e.g., a switch in an off state). Because of the non-ideality of shorts and opens, the amplifying transistor $M_B$ won't be presented at the power amplifier output with the theoretically expected optimum impedance due to the presence of parasitics (e.g., $C_{GD}$, $C_{GS}$).

In such an embodiment, capacitor $C_{tune}$ operates as a shunt capacitor between the RF output path (at the drain $M_B$) and the ground. The capacitance of capacitor $C_{tune}$ can be varied to minimize the impact of the parasitic capacitances on the efficiency of the amplifying power amplifier in the back-off operating mode (e.g., to improve the reflection coefficient seen by transistor $M_B$). In other words, capacitor $C_{tune}$ can be varied to tune the load of the active transistor $M_B$ without tuning the matching network 602. By not varying the matching network 602, power amplifier performance at maximum output power is not degraded.

Figure 7:
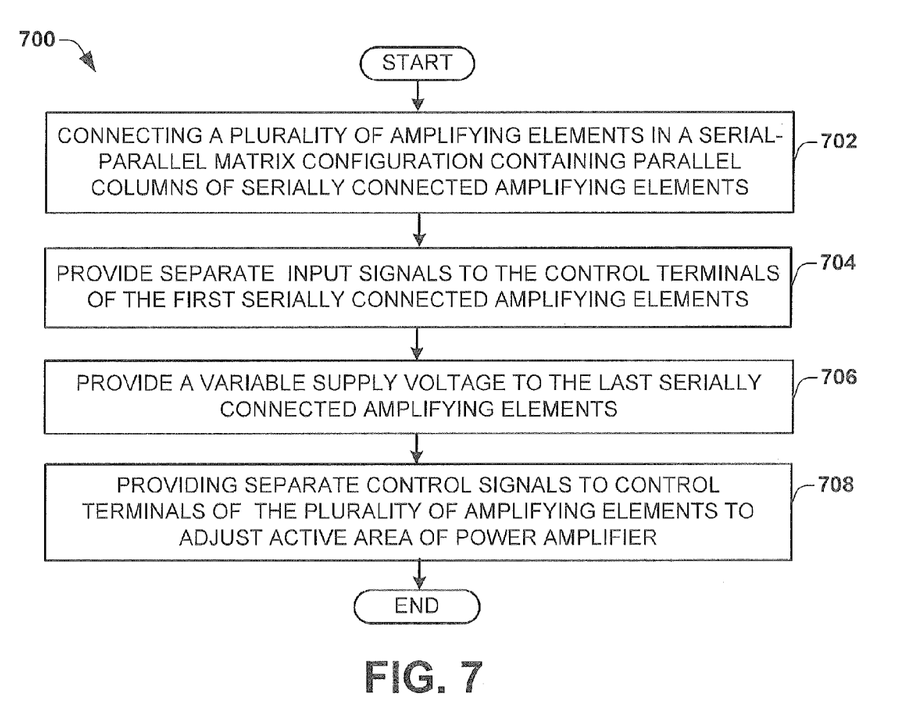
FIG. 7 illustrates a flow diagram of an exemplary method for operating a power amplifier.

FIG. 7 illustrates a flow diagram of an exemplary method 700 of operating a power amplifier. While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 1, 2, etc., are non-limiting examples of circuits that may be used to implement method 700). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At 702 a plurality of amplifying elements are connected in a serial-parallel matrix configuration containing parallel columns. More particularly, the serial-parallel matrix configuration contains M parallel columns, wherein respective columns have N amplifying elements connected in a series connection. The columns are connected in parallel to a common output path coupled to a DC supply voltage source configured to provide a supply voltage.

At 704 separate input signals are provided to the control terminals of the first serially coupled amplifying elements in each column. Therefore, a separate input signal is provided to each column for the column to operate upon (e.g., amplify). In one embodiment, the separate input signals comprise RF input signals generated from a common RF input signal.

At 706 a variable supply voltage is provided to the control terminals of the first serially coupled amplifying elements in each column.

At 708, separate control signals are provided to control terminals of separate amplifying elements comprised within the matrix. For example, a separate control signal may be provided to a separate control terminal of each amplifying element. The use of independent control signals allows for the active area of the power amplifier to be adjusted by operating a subset of the amplifier elements as amplifiers independent of the other amplifying elements in the matrix. For example, when operating at maximum output power, all amplifying elements operate as amplifiers to amplify the input signal(s). When operating in a reduced power, back-off operating mode, the independent control signals allow for a subset of the amplifying elements to operate as amplifiers while the remainder of amplifying elements operate as non-amplifiers that consume substantially no power.

Accordingly, method 700 allows for a variable supply voltage to be adjusted in conjunction with the selective operation of the power amplifying elements to amplify an input signal, resulting in an improved power amplifier efficiency over a broad range of output powers.

It will be appreciated that a radio-frequency input signal received at the power amplifier may be split into two or more RF input signals that are provided to separate columns of the power amplifier serial-parallel matrix configurations provided herein. The use of two or more RF input signals allow for columns of the power amplifier matrix to be separately operated to generate an amplified RF output signal.

Figure 8A:
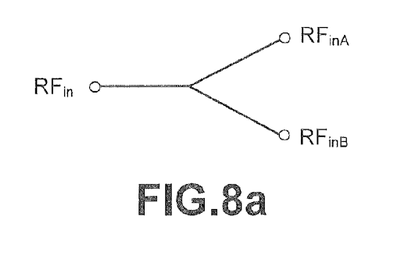
FIGS. 8a-8c illustrate three possible embodiments of circuitry that may be used to split an RF input signal into a plurality of RF input signals.
Figure 8B:
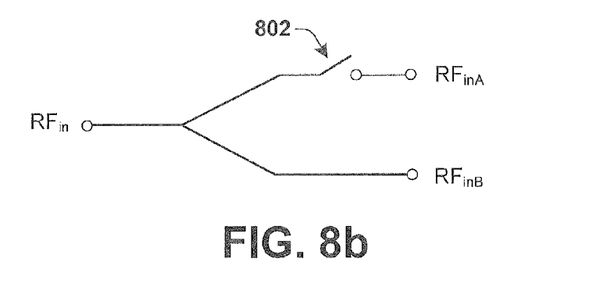
Figure 8C:
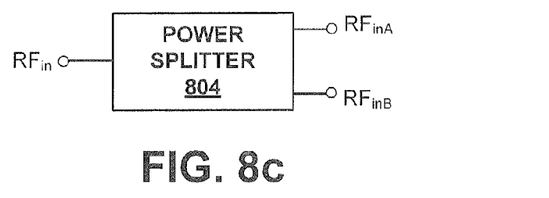

For example, a single RF input may be divided into two RF inputs. The inventor has appreciated that dividing a single RF input signal into two or more RF input signals may be done in a number of ways. FIGS. 8a-8c illustrate three possible embodiments of circuitry that may be used to split an RF input signal $RF_{in}$ into a plurality of RF input signals, $RF_{inA}$ and $RF_{inB}$. It will be appreciated that these embodiments are non-limiting embodiments and that the inventor has appreciated additional embodiments that may accomplish a similar ends.

FIG. 8a illustrates a circuitry in which nodes $RF_{inA}$, $RF_{inB}$, and $RF_{in}$ are coupled to a common node. As shown in FIG. 8a, an RF input signal is feed into node $RF_{in}$, which is split into a first branch that outputs an RF signal to node $RF_{inA}$ and a second branch that outputs an RF signal to node $RF_{inB}$. FIG. 8b illustrates an additional embodiment of a circuitry comprising a switch 802 located in the first branch that outputs an RF signal to node $RF_{inA}$.

FIG. 8c illustrates an additional embodiment of a circuitry comprising a power-splitter 804, which is used to generate RF signals at nodes $RF_{inA}$ and $RF_{inB}$ from an RF input signal is feed into node $RF_{in}$. The power splitter accepts an RF input signal from node $RF_{in}$ as an input and based thereupon, outputs signals RF signals output at nodes $RF_{inA}$ and $RF_{inB}$. The RF signals output at nodes $RF_{inA}$ and $RF_{inB}$ have substantially equal amplitudes and a high isolation therebetween.

Figure 9:
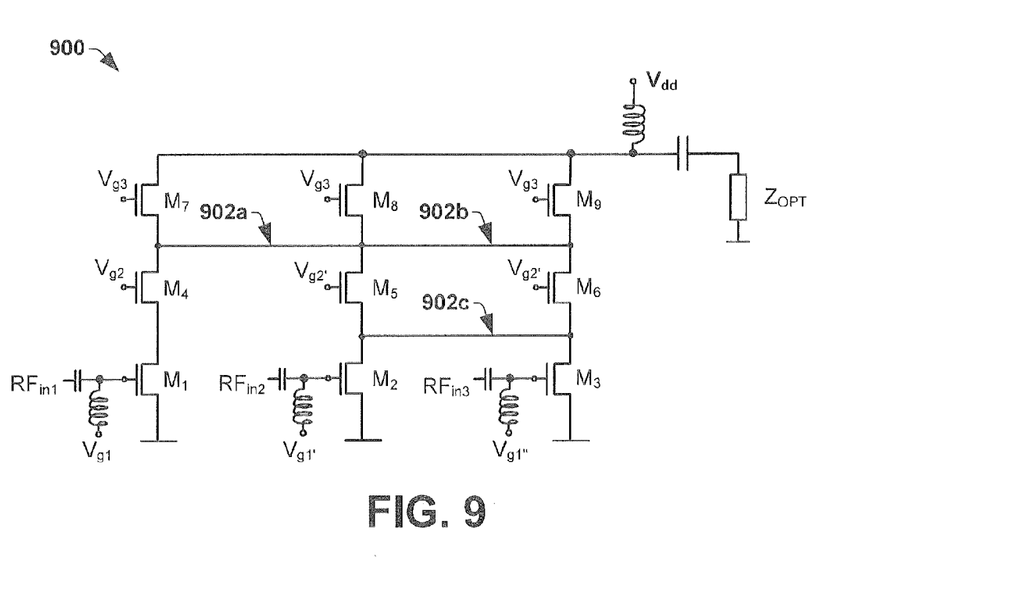
FIG. 9 illustrates a schematic diagram of another embodiment of a power amplifier circuit comprising a 3×3 transistor matrix with interconnections between internal nodes of the matrix.

Although the embodiments shown herein have illustrated a 2×2 matrix, it will be appreciated that the basic ideas disclosed herein can be applied to matrix configurations having a greater number of amplifying elements. For example, FIG. 9 illustrates a schematic diagram of another embodiment of a power amplifier circuit 900 having a 3×3 matrix of transistors that allows the power amplifier circuit 900 to be operated in a plurality of back-off operation modes. In one embodiment, the transistors $M_1$-$M_9$ have a substantially equal gate width so that the current density of each row is substantially equal. The matrix further comprises interconnections 902a-902c between internal nodes of the columns of stacked transistors in the matrix.

A maximum output power is achieved for the power amplifier at a supply $V_{dd}$ and with gate terminal biasing of $V_{g3}$, $V_{g2}=V_{g2'}$, $V_{g1}=V_{g1'}=V_{g1''}$, which causes all transistors to act as amplifiers and equally divides the output voltage across the rows of the parallel-series matrix. A first back-off operating mode with a 3.5 dB back-off may be achieved by lowering the supply voltage to $V_{dd}$⅔ and by raising $V_{g3}$ to switch the transistors $M_7$, $M_8$, and $M_9$ to an on switch. The gate-bias $V_{g2}$ and/or $V_{g1}$ can be lowered in order to switch off the branch M4-M1. A second back-off operating mode with a 9.5 dB back off may be achieved by further lowering the uppermost-drain-bias to $V_{dd}$\3, by switching on transistors $M_5$ and $M_6$ via acting on the gate bias voltage $V_{g2'}$, and by switching off transistor $M_2$.

It will be appreciated that the location of the interconnections between stacked transistors may be varied in alternative embodiments. As one of ordinary skill in the art will appreciate, such variation on the interconnections will not influence the conceptual functionality of the power amplifier disclosed herein, but can be exploited for design reasons.

Figure 10A:
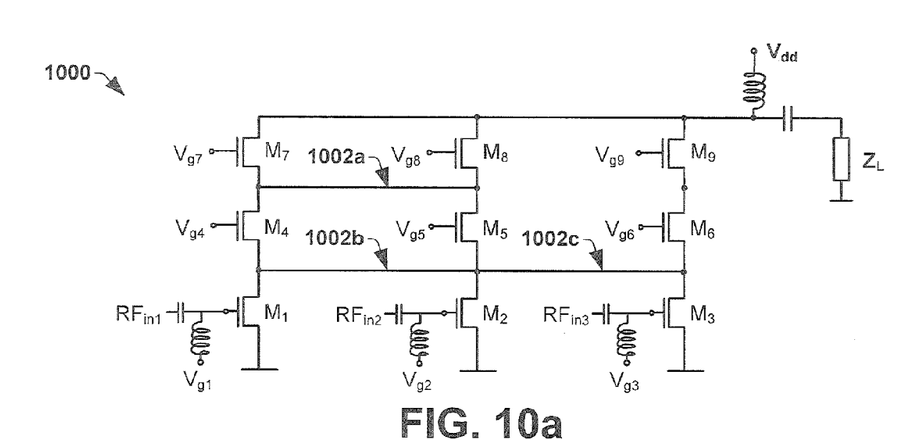
FIG. 10a illustrates a schematic diagram of a power amplifier showing an alternative embodiment of interconnections between the internal nodes of a matrix of transistors.
Figure 10B:
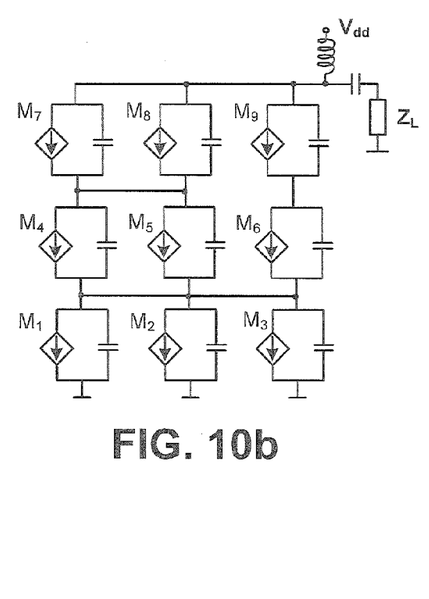
FIGS. 10b-10d show block diagrams of the transistors in the power amplifier of FIG. 10a illustrated as a current source, an open switch, or a short, for different output powers.
Figure 10C:
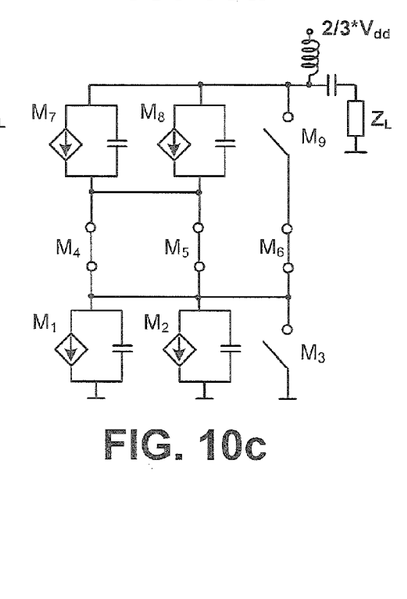
Figure 10D:
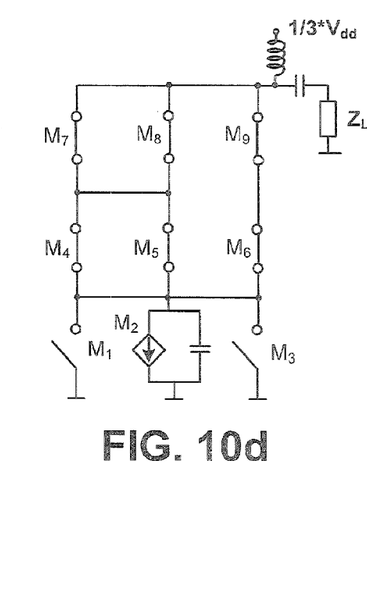

For example, FIG. 10a illustrates an alternative embodiment of a schematic diagram of a power amplifier circuit 1000 having interconnections 1002 between the internal nodes of a matrix of transistors. FIGS. 10b-10d visually exemplify the different operating modes.

As shown in FIG. 10b, the power amplifier circuit 1000 achieves a maximum output power for a supply voltage $V_{dd}$ using a gate bias configuration of $V_{g1}=V_{g2}=V_{g3}$, $V_{g4}=V_{g5}=V_{g6}$, and $V_{g7}=V_{g8}=V_{g9}$. Such a gate biasing causes all stages of the power amplifier circuit 1000 to amplify and to generate an output voltage that is divided equally across the rows of the parallel-series matrix. The resulting output power is the maximum output power.

As shown in FIG. 10c, a first back-off operating mode may be achieved by lowering the supply voltage to $(2*V_{dd})/3$ and by raising gate bias voltages $V_{g4}$, $V_{g5}$, and $V_{g6}$ to a value that switches transistors $M_4$, $M_5$ and $M_6$ to an on state (i.e., to a short). The gate bias voltages $V_{g3}$ and $V_{g9}$ are lowered in order to switch off transistors $M_3$ and $M_9$ (i.e., to an open). The resulting output power of such a first back-off operating mode will be ⅘th of the maximum output power (i.e., a 3.5 dB back-off).

As shown in FIG. 10c, a second back-off operating mode may be achieved by further lowering the supply voltage to $V_{dd}$/3 and by further adjusting gate bias voltages $V_{g7}$, $V_{g8}$, and $V_{g9}$ to switch on the transistors $M_7$, $M_8$, and $M_9$ and to lower gate bias voltage $V_{g1}$ to switch off transistor $M_1$. The resulting output power of such a second back-off operating mode will be ⅑$^{th}$ of the maximum output power (i.e., a 9.5 dB back off).

Figure 11A:
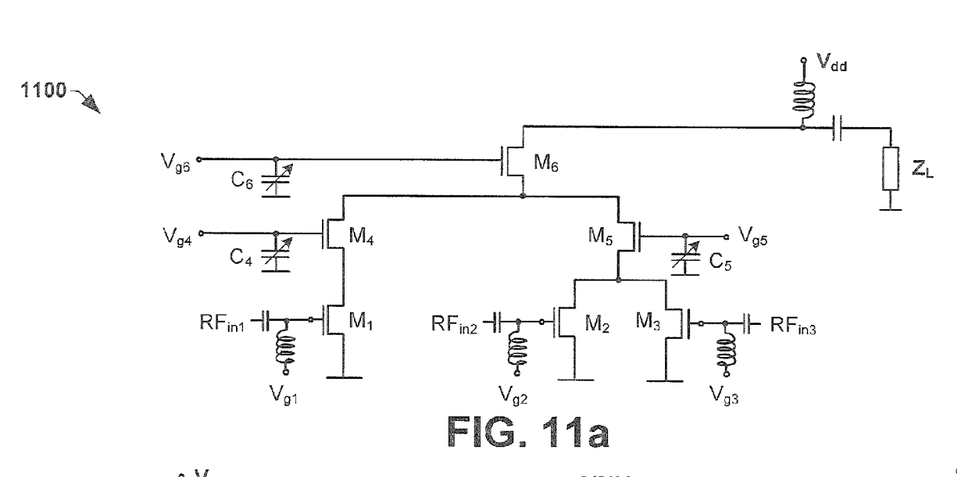
FIG. 11a illustrates another alternative embodiment of the power amplifier shown in FIG. 9.
Figure 11B:
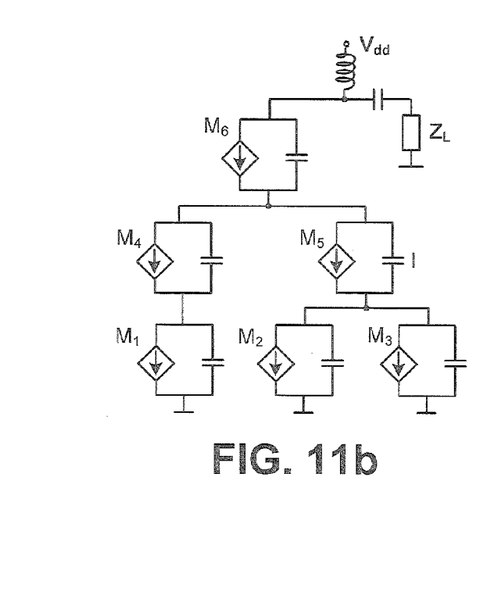
FIGS. 11b-11d show block diagrams of the transistors in the power amplifier of FIG. 11a illustrated as a current source, an open switch, or a short, for different output powers.
Figure 11C:
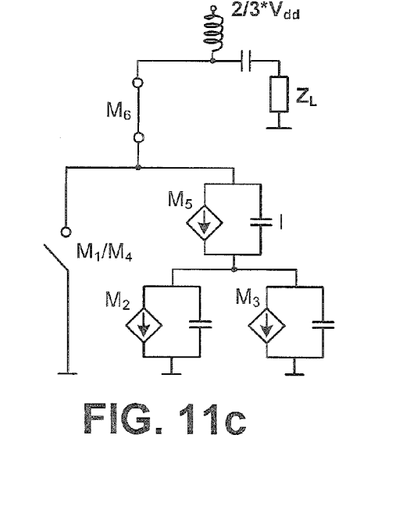
Figure 11D:
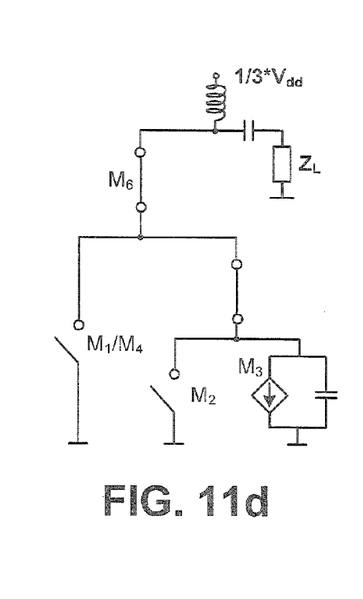

FIGS. 11a-11d illustrate another alternative embodiment of the power amplifier. FIG. 11a illustrates a schematic diagram of the power amplifier circuit 1100. FIGS. 11b-11d show block diagrams of the transistors illustrated as a current source, an open switch, or a short.

As illustrated in FIG. 11a, a single transistor $M_6$, having a gate width equal to the sum of the gate widths of transistors $M_7$-$M_9$ in FIG. 9, has a drain coupled to the supply voltage $V_{dd}$ and a source coupled to two parallel transistors $M_4$ and $M_5$. In one embodiment, the cumulative gate width of transistors $M_4$ and $M_5$ is equal to the gate width of transistor $M_6$. Transistor $M_4$ has a source that is coupled to transistor $M_1$. In one embodiment, transistors $M_1$ and $M_4$ have an equal gate width. Transistor $M_5$ has a source that is coupled to parallel transistors $M_2$ and $M_3$. In one embodiment, the cumulative gate width of transistors $M_2$ and $M_3$ is equal to the gate width of transistor $M_5$.

The operating mode that corresponds to the maximum output-power is graphically represented in FIG. 11b where all the transistors in the matrix are amplifying.

A first back-off operating mode may be achieved by lowering the supply voltage to $(2*V_{dd})/3$ and by raising $V_{g6}$ to a voltage value that switches transistors $M_6$ to an on state (i.e., $M_6$ acts as a short). The gate bias $V_{g1}$ and/or $V_{g4}$ is lowered in order to switch off transistors $M_1$ and $M_4$. The resulting output power of such a first back-off operating mode will be ⅘$^{th}$ of the maximum power (i.e., a 3.5 dB back-off).

A second back-off operating mode may be achieved by further lowering the supply voltage to $V_{dd}$/3 and by changing gate bias $V_{g5}$ to switch on transistors $M_5$ and by changing gate bias $V_{g2}$ switching off transistor $M_2$. The output power of such a second back-off mode will be ⅑$^{th}$ that of the maximum output power (i.e., a 9.5 dB back off).

Figure 12:
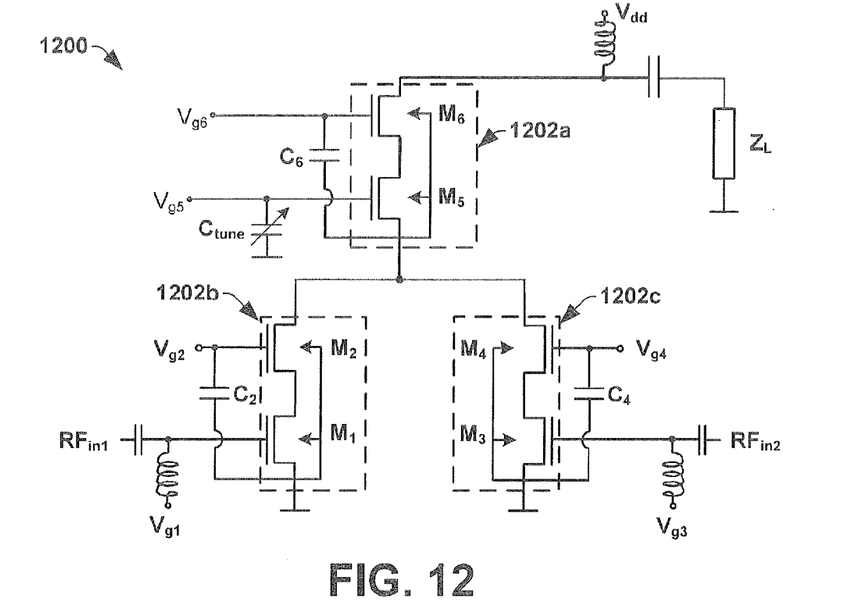
FIG. 12 illustrates an alternative embodiment of an exemplary power amplifier comprising cascoded transistors.

FIG. 12 illustrates an alternative embodiment of an exemplary power amplifier circuit 1200 as provided herein. The power amplifier circuit 1200 of FIG. 12 utilizes cascodes in place of the transistors illustrated in previous embodiments. For example, FIG. 12 illustrates cascodes 1202 comprising two transistors, with one operating as a common source and the other as a common gate.

In one embodiment, the cascode 1202a comprises two stacked transistors. $M_6$ and $M_5$, which may have the same width. The source of cascode 1202a is coupled to two cascodes 1202b and 1202c connected in parallel. Cascode 1202b comprises transistors $M_1$ and $M_2$, which may have a gate width that is half the gate width of transistors $M_5$ and $M_6$. Cascode 1202b comprises transistors $M_3$ and $M_4$, which may have a gate width that is half the gate width of transistors $M_5$ and $M_6$. In one alternative embodiment, the cascodes 1202b and 1202c may have unequal gate widths that are substantially equal to the gate width of cascode 1202a. In another alternative embodiments, the cascodes 1202b and 1202c may having total gate widths that are unequal (e.g., wider) to the gate width of cascode 1202a.

Blocking-capacitors $C_6$, $C_2$, and $C_4$ are design accordingly to the requirements of the cascodes in terms of gain, output power and efficiency. Biasing is provided by a controlled biasing block. The capacitor $C_{tune}$ balances the RF swing at the uppermost drain across the rows (e.g., $M_6$, $M_5$, and $M_2$ and $M_4$, $M_1$, and $M_3$) and may be realized also as varactor or as a dynamically reconfigurable bank of standard capacitors available in the technology chosen for the fabrication of the circuit.

FIG. 13 illustrates an alternative embodiment of an exemplary power amplifier circuit 1300 as provided herein. The power amplifier circuit 1300 of FIG. 13 design is derived from the embodiment of FIG. 12 by dividing the transistors $M_5$ and $M_3$ in two parallel transistors with different gate-nodes (respectively $M_6$-$M_7$ and $M_2$-$M_3$ in FIG. 13).

The power amplifier circuit 1300 can be operated at a maximum output power and at various back off level operating modes as summarized below in Table 1.

TABLE 1 operating modes of power amplifier circuit 1300

| Mode | Active transistors | On switch transistors | Off switch transistors | Pout | BO level |
|---|---|---|---|---|---|
| 1 | All | — | — | $P_{max}$ | 0 dB |
| 2 | $M_2$, $M_3$, $M_5$, $M_7$ | $M_8$ | $M_1$, $M_4$, $M_6$ | (9/16) * $P_{max}$ | 2.5 dB |
| 3 | $M_3$ | $M_8$, $M_7$, $M_6$, $M_5$ | $M_1$, $M_4$, $M_2$ | (1/16) * $P_{max}$ | 12 dB |

In order to ensure that the current-density on each transistor remains unchanged regardless of the back-off mode, transistors $M_1$, $M_3$, $M_4$ and $M_6$ may be chosen to have a same width, transistor $M_2$ may be chosen to have a width twice as wide as $M_1$, transistors $M_5$ and $M_7$ may be chosen to have a width three times as wide as $M_1$, and transistor $M_3$ may be chosen to have a width that is four times as wide as $M_1$. Widths are illustrated in FIG. 13 normalized to the width w of the reference transistor $M_1$.

The gates of the transistors $M_1$, $M_2$ and $M_3$ are DC-decoupled. An RF input signal is input to the power amplifier as $RF_{in1}$, $RF_{in2}$, and $RF_{in3}$ at gate terminals of transistors $M_1$, $M_2$, and $M_3$. Blocking capacitors $C_4$, $C_5$, and $C_8$ and tuning capacitors $C_6$ and $C_7$ may comprise varactors or banks of switchable standard capacitors available in the technology chosen for the fabrication of the circuit.

Figure 14:
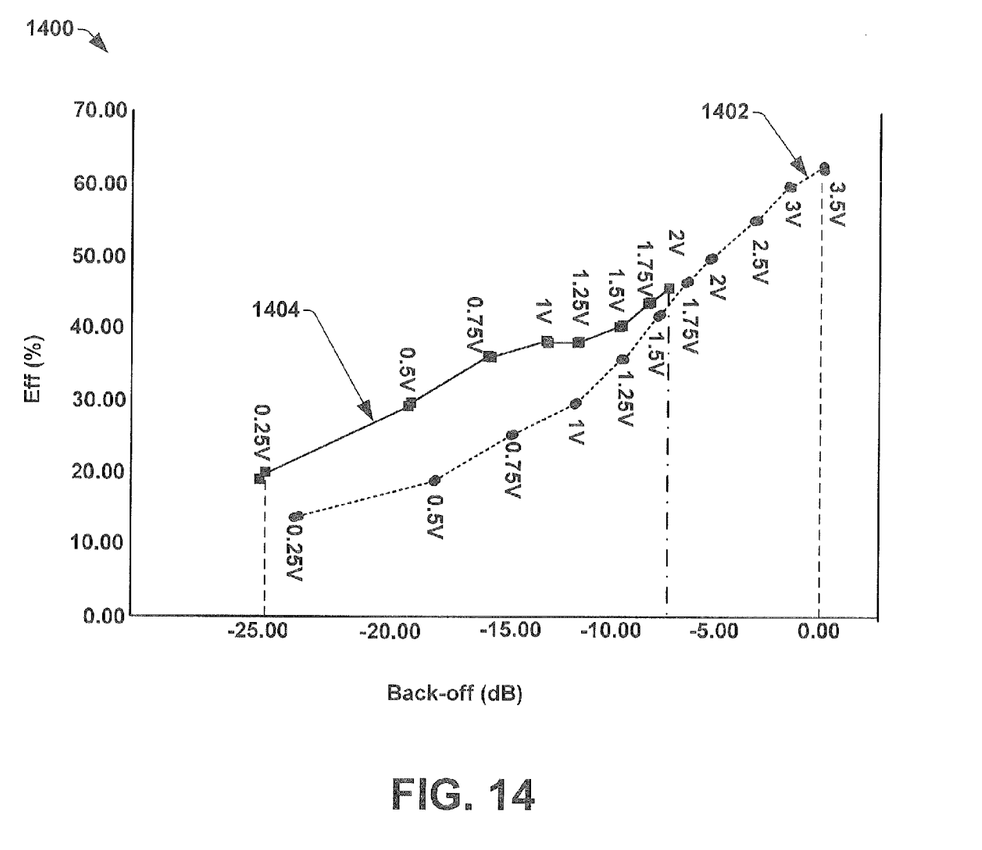
FIG. 14 illustrates a graph showing measurements of the efficiency of a power amplifier, similar to that illustrated in FIG. 13, as a function of output power.

FIG. 14 illustrates a graph 1400 showing measurements of the efficiency of a power amplifier, similar to that illustrated in FIG. 13, as a function of back-off (in dB) with the output load held at a value optimized for maximum output power. The back-off extends along the x-axis from 0 dB at maximum output power to approximately −25 dB. The dashed line 1402 shows the efficiency of the power amplifier with all amplifying elements operating as amplifiers (e.g., at a maximum output power). As shown in graph 1400, the efficiency of dashed line 1402 decreases as the supply voltage provided to the drain of the top cascode is reduced.

The solid line 1404 shows the efficiency of the power amplifier with uppermost cascode switched to short and one of bottom cascodes switched off (e.g., in a back-off operating mode having an active area of ⅓ that of maximum output power). As illustrated in graph 1400, at a back-off of approximately −7 dB the efficiency of the back-off operating mode 1404 improves over the maximum output power 1402. Thus, graph 1400 illustrate that the back off operating mode achieves a greater efficiency at high back-off (a low output power), when a subset of amplifying elements operate as amplifiers and the remainder of amplifying elements operate as non-amplifying elements). Therefore, the disclosed power amplifier circuit, configured to operate at both maximum output power and in a back-off operating mode, can at a high efficiency over a broad range of output powers.

Graph 1400 also illustrates improvement to the efficiency of a DC-DC converter (e.g., corresponding to DC-DC converter 302) that is achieved using a back-off operating mode. As shown in FIG. 14, to reach a certain output power a higher uppermost drain voltage is needed for partially switched off solutions with respect to structures that are completely turned on. For example, a back-off of −7 dB is achieved at a power of 2V for the back-off mode 1404 while a back-off of −7 bB is achieved at a lower power of approximately 1.6V for a power amplifier operated at maximum output power 1402. Since the efficiency of a DC-DC converter drops together with the produced voltage the overall efficiency of the power amplifier is improved using a back-off operating mode.

Although the invention has been illustrated and described with respect to one or more implementations, alterations and/or modifications may be made to the illustrated examples without departing from the spirit and scope of the appended claims. For example, although power amplifier matrices have been often described as 2×2 or 3×3 matrices of transistors, it will be appreciated that the concepts disclosed herein may be applied to any size matrix of transistors. Furthermore, the disclosed power amplifiers may be applied to one or more stages of a multi stage power amplifier, in additional embodiments.

Furthermore, the classes of operation of a power amplifiers does not a restrict application of the invention presented here. One of ordinary skill in the art will appreciate that any class of operation (e.g., A, AB, etc.) can implement an amplification stage according to the hardware here described. Moreover, even though the figures illustrate power amplifiers comprising n-mos transistors, one of ordinary skill in the art will appreciate that the idea presented herein may be implemented as a matrix of n-mos transistors, p-mos transistors, or a combination thereof.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A power amplifier circuit, comprising:
 a plurality of amplifying elements disposed in a serial-parallel matrix configuration containing rows and parallel columns coupled to a common output path, wherein respective parallel columns comprise two or more of the plurality of amplifying elements connected in a series connection, and wherein the amplifying elements respectively comprise a control terminal configured to receive an independent control signal that allows amplifying elements to be operated independently;

a supply voltage source coupled to the common output path and configured to provide a variable supply voltage to output terminals of the last amplifying elements in the series connection; and a controller configured to selectively provide independent control signals to control terminals of the plurality of amplifying elements, wherein the independent control signals cause respective amplifying elements to operate as an amplifier, an open switch, or a closed switch.

2. The power amplifier circuit of claim 1, the subset of the plurality of amplifying elements comprises a fraction of the amplifying elements in at least one of the parallel columns and a fraction of amplifying elements in at least one of the rows.

3. The power amplifier circuit of claim 2, wherein in a reduced power, back-off operating mode, a subset of the plurality of amplifying elements are activated to operate as amplifiers while a remainder of amplifying elements operate as non-amplifiers that consume substantially no power.

4. The power amplifier circuit of claim 1, wherein the bias controller is configured to adjust the number of amplifying elements operating as amplifiers based upon a value of the variable supply voltage so that changes in the supply voltage are in ratio to changes in a power amplifier output power and a power amplifier output current.

5. The power amplifier circuit of claim 1, wherein the control terminals of first amplifying elements in the series connection of the parallel columns are configured to receive separate RF input signals, which are amplified according to different amplification paths of the power amplifier.

6. The power amplifier circuit of claim 1, further comprising:
an electrical connection between amplifying elements in the series connection of adjacent parallel columns.

7. The power amplifier circuit of claim 1, wherein at least one of the columns, comprises:
a first transistor having a gate terminal configured to receive a first radio frequency input signal, connected in parallel to a second transistor having a gate terminal configured to receive a second radio frequency input signal; and
a third transistor having a source coupled to drains of the first and second transistors;
wherein the first and second transistors have gate widths that are one-half a gate width of the third transistor.

8. The power amplifier circuit of claim 7, further comprising a tuning capacitor coupled to a gate terminal of the third transistor and configured to adjust the output impedance seen by the first or second transistor when operating as amplifiers during the reduced power, back-off operating mode.

9. The power amplifier circuit of claim 1, wherein a parallel column, comprises:
a first cascode configured to receive a first radio frequency input signal connected in parallel to a second cascode configured to receive a second radio frequency input signal, wherein the first and second cascodes comprise stacked transistors; and
a third cascode having a source coupled to drains of the first and second cascode.

10. A power amplifier, comprising:
a plurality of transistor devices disposed in a serial-parallel matrix configuration comprising parallel columns, having series connected transistor devices which are coupled to a common output path, wherein:
the transistor devices respectively comprise a gate terminal configured to receive an independent gate bias voltage that controls the flow of current between a source and a drain of the transistor;
the gate terminals of first serially connected transistors of the parallel columns are configured to further receive separate RF input signals;
a supply voltage source coupled to the common output path and configured to provide a variable supply voltage to drain terminals of the last transistor devices in the series connection; and
a controller configured to selectively provide the independent gate bias voltages to the gate terminals of the plurality of transistor devices, wherein the independent gate bias voltages cause respective transistor devices to operate as an amplifier, an open switch, or a closed switch,
wherein in a reduced power, back-off operating mode a subset of the plurality of transistor devices are activated to operate as amplifiers, while a remainder of the transistor devices operate as non-amplifiers that consume substantially no power.

11. The power amplifier of claim 10, wherein the subset comprises a fraction of the transistor devices in at least one of the parallel columns and a fraction of the transistor devices in at least one of row of the serial-parallel matrix.

12. The power amplifier of claim 10, further comprising:
an electrical connection between transistor devices in the series connection of adjacent parallel columns.

13. The power amplifier of claim 10, wherein the separate RF input signals are amplified according to different amplification paths of the power amplifier.

14. A method for operating a power amplifier, comprising:
connecting a plurality of amplifying elements in a serial-parallel matrix configuration comprising parallel columns of serially connected amplifying elements,
providing a variable supply voltage to the last serially connected amplifying elements; and
providing independent control signals to control terminals of separate amplifying elements, wherein the control signals operate respective amplifying elements as a short, an amplifier, or an open, such that a subset of the plurality of amplifying elements can be activated to operate as amplifiers while a remainder of amplifying elements operate as non-amplifiers that consume substantially no power.

15. The method of claim 14, further comprising:
providing separate input signals to the control terminal of the first amplifying element in the parallel columns.

16. The method of claim 14, wherein at a maximum output power, the plurality of amplifying elements are configured to operate as amplifiers.

17. The method of claim 14, wherein in a back-off operating mode, a subset of the plurality of amplifying elements are configured to operate as amplifiers, while a remainder of the plurality of amplifying elements are configured to operate as a short circuit/closed switch or as an open switch.

18. The method of claim 17, wherein the subset comprises a fraction of the amplifying elements in at least one of the parallel column and a fraction of amplifying elements in at least one of row of the serial-parallel matrix.

19. A power amplifier circuit, comprising:

a plurality of amplifying elements disposed in a serial-parallel matrix configuration comprising a plurality of parallel columns having two or more of the plurality of amplifying elements connected in a series connection between a ground terminal and a common output path, wherein the amplifying elements respectively comprise a control terminal configured to receive an independent control signal that allows amplifying elements to be operated independently; and a controller configured to selectively provide independent control signals to control terminals of the plurality of amplifying elements, wherein the independent control signals cause respective amplifying elements to operate as an amplifier, an open switch, or a closed switch.

* * * * *